United States Patent [19]

Degenford et al.

[11] Patent Number: 4,578,629
[45] Date of Patent: Mar. 25, 1986

[54] MONOLITHIC MICROWAVE "SPLIT LOAD" PHASE INVERTER FOR PUSH-PULL MONOLITHIC FET AMPLIFIER CIRCUITS

[75] Inventors: James E. Degenford, Ellicott City; Daniel C. Boire, Ferndale, both of Md.

[73] Assignee: Westinghouse Electric Corp., Pittsburgh, Pa.

[21] Appl. No.: 530,809

[22] Filed: Sep. 9, 1983

[51] Int. Cl.⁴ .............................................. H03F 3/26
[52] U.S. Cl. ..................................... 323/217; 330/277; 357/41
[58] Field of Search ................ 323/217; 330/269, 275, 330/276, 286, 277, 255, 262, 300, 301; 357/22, 41, 51

[56] References Cited

U.S. PATENT DOCUMENTS

| | | | |
|---|---|---|---|
| 3,626,216 | 12/1971 | Bergman | 330/301 |
| 3,976,952 | 8/1976 | Shaver | 330/301 |
| 4,050,031 | 9/1977 | Gray et al. | 330/300 |
| 4,097,814 | 6/1978 | Cohn | 330/286 |
| 4,288,804 | 9/1981 | Kikuchi et al. | 357/42 |
| 4,356,453 | 10/1982 | Sueyoshi | 330/277 |
| 4,432,008 | 2/1984 | Maltiel | 357/41 |

OTHER PUBLICATIONS

Ino, M., et al., "Intrinsic Response Time of Normally Off MESFETs of GaAs, Si and InP", IEEE Trans. PG-MTT, V. MTT-28, No. 5, May 1980, pp. 456-459.

Sowter, B., "Balanced Drive Circuit", IBM Technical Disclosure Bulletin, v. 8, No. 1, Jun. 65, p. 189.

Hori, S., et al., "GaAs Monolithic MIC's for Direct Broadcast Satellite Receivers", IEEE PGMT-T, vol. 31, No. 12, Dec. 83, pp. 1089-1095.

Gupta, A. et al., "Low-Noise MESFET's for Ion-Implanted GaAs MMIC's,", IEEE PGMT-T, vol. 31, No. 12, Dec. 83, pp. 1072-1075.

Hunter, L. P.: "Handbook of Semiconductor Electronics" Section 11, pp. 11-154 and 11-155, McGraw-Hill Book Company, New York, 1970.

Primary Examiner—Patrick R. Salce
Assistant Examiner—D. L. Rebsch
Attorney, Agent, or Firm—W. G. Sutcliff

[57] ABSTRACT

A phase inverter generates two signals 180° out-of-phase at microwave frequencies in response to an input microwave signal incorporating a semiconductor substrate such as gallium arsenide, a transistor having a drain, source and gate electrode, an ion-implanted resistor coupled between the drain electrode and a voltage source, a second ion-implanted resistor coupled between the source electrode and ground potential, a compensation network such as a capacitor coupled between the source electrode and ground potential, and a biasing network for establishing a bias voltage on the gate electrode. The phase inverter which may be monolithic overcomes the problem of the size of quarter wavelength slot lines to generate signals with 180° phase relationship.

9 Claims, 4 Drawing Figures

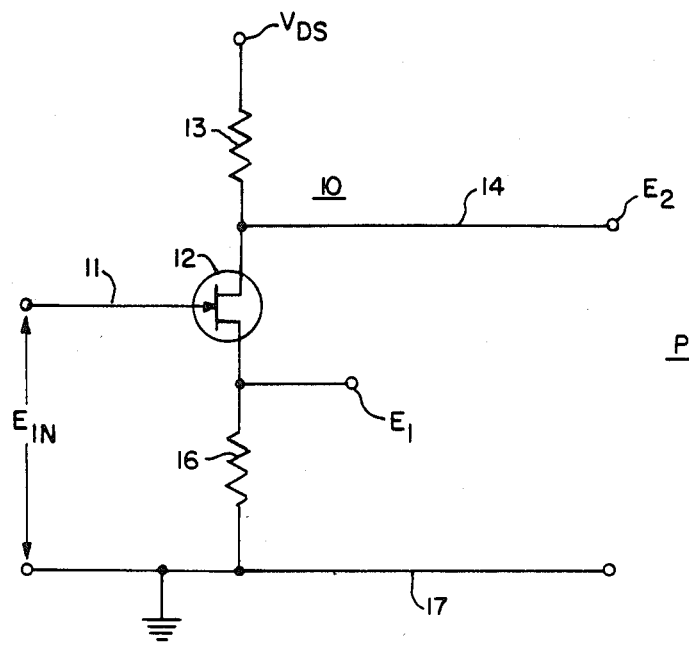
PRIOR ART
FIG. 1.
FIG. 2.
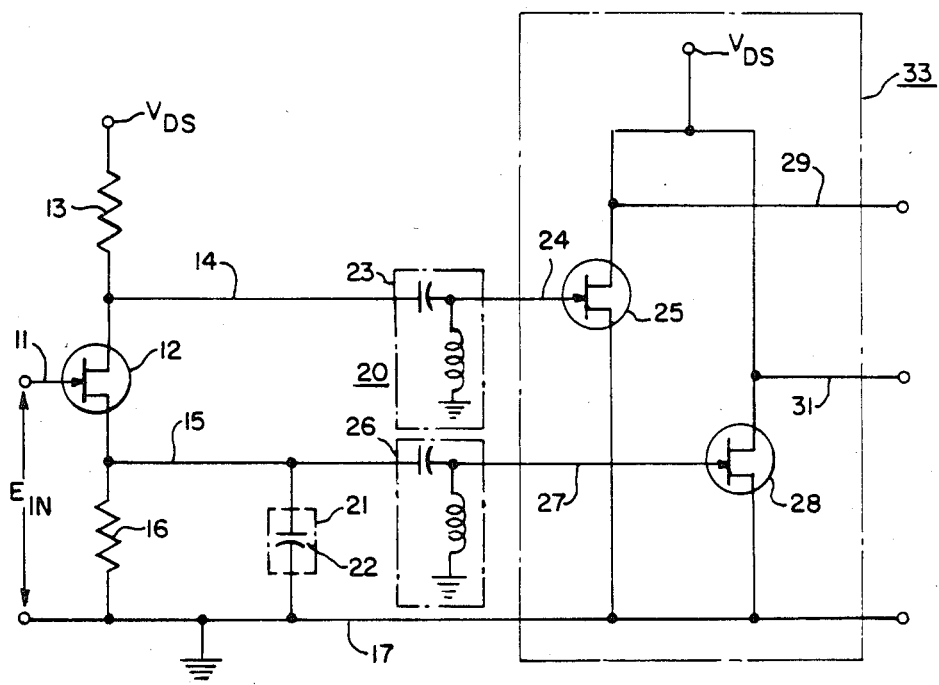

MONOLITHIC MICROWAVE "SPLIT LOAD" PHASE INVERTER FOR PUSH-PULL MONOLITHIC FET AMPLIFIER CIRCUITS

BACKGROUND OF THE INVENTION

1. Field of the Invention

This invention relates to phase inverters and, more particularly, to a microwave phase inverter.

2. Description of the Prior Art

The advantages of push-pull amplifier circuits, i.e., cancellation of even harmonics at the output, reduced susceptibility to power supply ripple voltages, etc., are well known. In the past few years, push-pull microwave field effect transistor amplifiers have been fabricated in a hybrid format. That is, individual transistors and capacitors were interconnected on a supporting substrate which contained metallization for interconnection at microwave frequencies. These circuits have typically used slot-microstrip tees to provide two input signals that are 180° out-of-phase for the push-pull amplifier. One example of a push-pull power amplifier using slot lines is described in U.S. Pat. No. 4,097,814 which issued on June 27, 1978 to M. Cohn and is assigned to the assignee herein. Because the slot line tee employs λ/4 slot lines, it is relatively large and requires photoengraving and registration on both sides of the substrate, which is difficult to achieve in monolithic integrated circuits.

A split-load phase inverter as shown in FIG. 1 is a common circuit which is used at lower frequencies to provided phase inversion for push-pull amplifiers. The split-load phase inverter has two resistors, one coupled to the source and one coupled to the drain of a field effect transistor which are equal in value to provide equal output voltages which are 180° out-of-phase. The gain of a split-load phase inverter approaches unity if the transconductance, $g_m$ times the value of the resistance R in ohms is much much greater than one.

It is therefore desirable to provide a monolithic microwave split-load phase inverter.

It is further desirable to provide a split-load phase inverter on a gallium arsenide substrate incorporating ion-implanted resistors.

It is further desirable to provide a monolithic microwave split-load phase inverter having a compensation network to balance the source-to-ground capacitance with the drain-to-ground capacitance at microwave frequencies.

SUMMARY OF THE INVENTION

A phase inverter for generating two output signals 180° out-of-phase from an input signal is described comprising a semiconductor substrate such as a gallium arsenide semi-insulating substrate having an active region therein, a field effect transistor in the active region having a drain-and-source electrode and a gate electrode therebetween, an ion-implanted resistor coupled between the drain electrode and a voltage terminal, an ion-implanted resistor coupled between the source electrode and a ground terminal, an input signal coupled to the gate electrode, a bias network coupled to the gate electrode, and output terminals coupled to the drain-and-source electrodes for coupling out the first and second signals respectively.

BRIEF DESCRIPTION OF THE DRAWINGS

FIG. 1 is a schematic diagram of a split-load phase inverter circuit;

FIG. 2 is a schematic circuit of a microwave split-load phase inverter; and

DESCRIPTION OF THE PREFERRED EMBODIMENT

Figure 3:
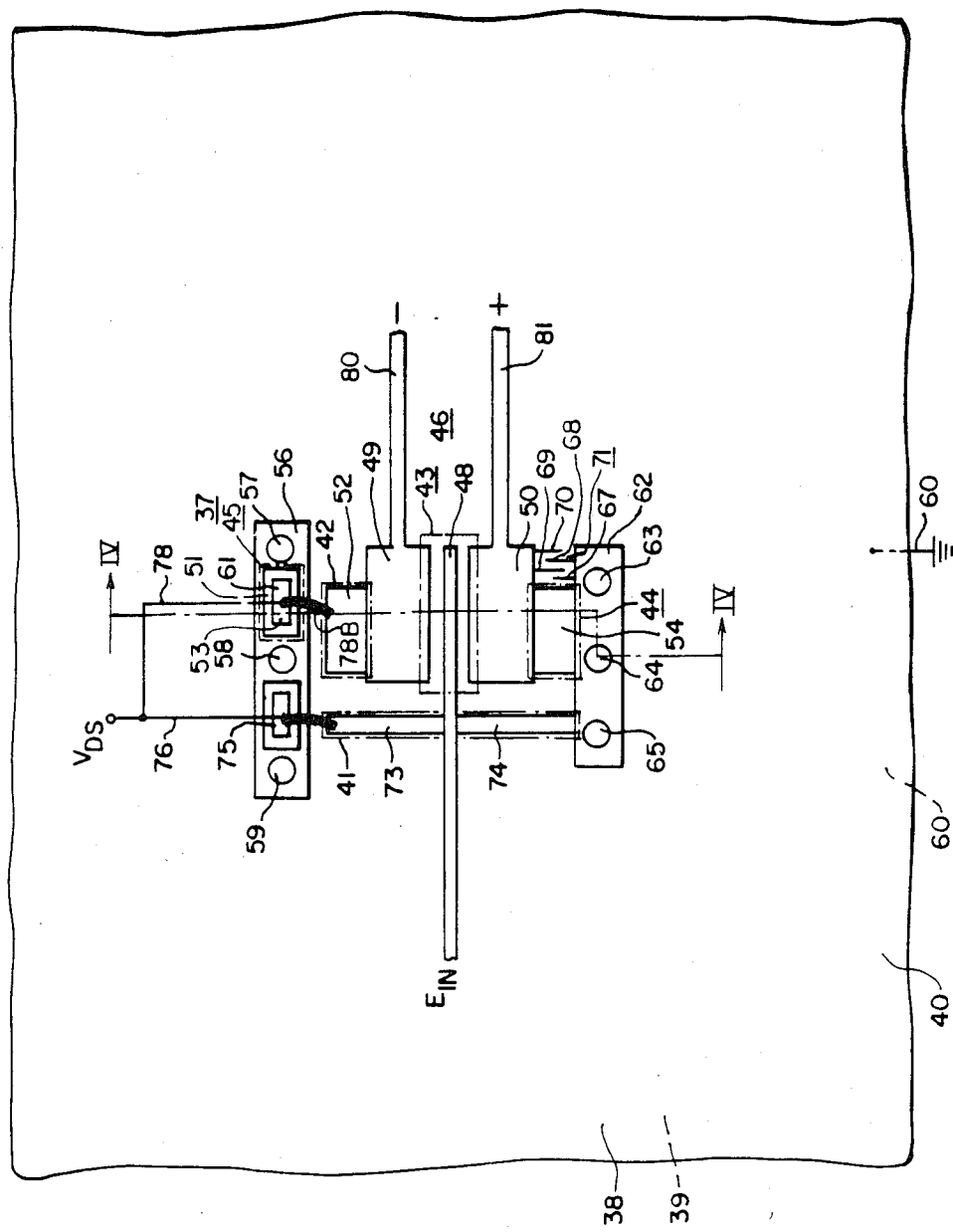
FIG. 3 is a plan view of one embodiment of the invention.

Referring to the drawing and in particular to FIG. 1, a split-load phase inverter circuit 10 is shown. An input signal is coupled over line 11 to the gate of a field effect transistor 12. The drain of field effect transistor 12 is coupled through a resistor 13 to a voltage source $V_{DS}$. The drain is also coupled over line 14 to an output terminal to provide an output signal $E_2$. The source of field effect transistor 12 is coupled over line 15 to an output terminal to provide an output signal $E_1$. The source is also coupled through resistor 16 to ground potential over line 17.

In operation, transistor 12 conducts current in response to the voltage on its gate, causing current to pass through transistor 12. The current passing through transistor 12 will cause a voltage $E_1$ to occur across resistor 16 and a voltage $E_2$ to occur across resistor 13. As the current increases through transistor 12, voltage $E_1$ will increase and voltage $E_2$ will decrease. Since the same current causes the voltage drop across resistors 13 and 16, the output voltages will be 180° out-of-phase with respect to each other. Typically, the value of resistor 13 will equal the value of resistor 16 so that the amplitude of the voltage swings of signals $E_1$ and $E_2$ will be equal.

FIG. 2 shows a schematic diagram of a microwave split-load phase inverter 20 providing anti-phase input signals to push-pull amplifier 33. Typically, the drain-to-ground capacitance and the source-to-ground capacitance of transistor 12 are not equal and the difference in reactance becomes significant at microwave frequencies, causing the outputs on lines 14 and 15 to be unbalanced. Compensation network 21 is added to equalize the output impedances on lines 14 and 15. The nature of compensation network 21 is heavily dependent upon the field effect transistor configuration and hence will vary depending upon the field effect transistor used; however it may for some transistors be a shunt capacitance 22 shown in FIG. 2. Compensation network 21 is coupled between line 15 and line 17.

The signal at line 14 is coupled through impedance transforming network 23 and over line 24 to the gate of transistor 25. The signal at line 15 is coupled through impedance transforming network 26 and over line 27 to the gate of transistor 28. The source of transistors 25 and 28 are coupled to ground potential via line 17. The drain of transistor 25 is coupld over line 29 to an output terminal and to voltage $V_{DS}$. The drain of transistor 28 is coupled over line 31 to an output terminal and to voltage $V_{DS}$. The signals on lines 29 and 31 are 180° out-of-phase and represent the output of push-pull amplifier 33.

Impedance transforming networks 23 and 26 in combination with transistors 25 and 28 provide a large resistive load to the output of inverter circuit 10. The large resistive load increases the effective resistance at the drain and source of transistor 12. The drain of transistor 12 sees an effective resistance of resistor 13 in parallel with impedance transforming network 23 and transistor 25. The source of transistor 12 sees an effective resistance of resistor 16 in parallel with impedance transforming network 26 and transistor 28. The effective resistance, $R_{eff}$, must be large in order to avoid excessive loss of gain. Phase inverter circuit 20 approaches unity gain when the transconductance $g_m$ times the effective resistance $R_{eff}$ is much much greater than one. Typically, transistors 12, 25 and 28 have a transconductance in the range from 80 to 100. This requires that the effective resistance $R_{eff}$ must be greater than 50 ohms. Impedance transforming networks 23 and 26 function to transform the relatively low gate-to-source input impedance of transistors 25 and 28, respectively, up to the order of 50 to 100 ohms.

Referring to FIG. 3, a monolithic microwave phase inverter 37 is shown. A semiconductor substrate 40 which may be, for example, silicon, indium phosphide or gallium arsenide which may be semi-insulating, having active regions 41 through 45 on upper surface 38. Active regions 42 and 45 are spaced apart with active region 43 positioned between active regions 42 and 44. In active region 43, a metal semiconductor field effect transistor 46 is formed, which may be N channel, having a gate electrode 48, a drain electrode 49 and a source electrode 50. Active region 42 contains an ion-implanted resistor 52. Active region 44 contains an ion-implanted resistor 54. Alternatively, resistors 52 and 54 may be thin film resistors. Drain electrode 49 extends from active region 43 over to ion-implanted resistor 52 to make connection with one side of ion-implanted resistor 52. Source electrode 50 extends from active region 43 over to ion-implanted resistor 54 and makes contact with one side of ion-implanted resistor 54. Adjacent to active region 42 is active region 45 containing metallization 56 having vias 57 through 59 connecting metallization 56 to metallization 60 on the lower surface 39 of substrate 40. Above metallization 56 is mounted a thin film capacitor 61 having a dielectric 51 and an upper electrode 53 which is coupled by means of an air bridge of metallization or gold-bond wire 78B to the other side of resistor 52.

Metallization 62 is positioned adjacent and extends over active region 44 and is coupled to one side of resistor 54. Metallization 62 has vias 63 through 65 which couple metallization 62 to metallization 60 on the lower surface 39 of substrate 40. Metallization 62 may have fingers 67 and 68 which are positioned between fingers 69 and 70 extending from source electrode 50 to form an interdigitated capacitor 71. Interdigitated capacitor 71 forms a compensation network so that the drain-to-ground capacitance and source-to-ground capacitance of transistor 46 are substantially equal or balanced. Alternatively, capacitor 71 may be an overlay capacitor which is well-known in the art. Drain electrode 49 and source electrode 50 may be rectangular in shape with gate electrode 48 therebetween, rectangular in shape and parallel to the edges of the drain-and-source electrodes. Gate electrode 48 may extend colinearly beyond active region 43 and across active region 41 to an input terminal. The width of metallization 48 beyond active region 43 may be adjusted to provide a predetermined impedance with substrate 40 and metallization 60 on the lower surface 39 of substrate 40. Active region 41 may contain ion-implanted resistors 73 and 74 which may be positioned on either side of metallization 48 and coupled to metallization 48. The other end of resistor 74 may be coupled to metallization 62. The other end of resistor 73 may be coupled by means of air bridge or gold-bond wire to the top electrode of capacitor 75 having a bottom electrode coupled to metallization 56. The upper electrodes of capacitors 75 and 61 are also coupled to a source of voltage, $V_{DS}$, over gold-bond wires 76 and 78A, $V_{DS}$ may be in the range from 5 to 10 volts. Resistors 73 and 74 are positioned between ground and voltage, $V_{DS}$, to provide a bias voltage to the gate electrode of transistor 46. Alternatively, resistors 73 and 74 may be thin film resistors. Capacitors 61 and 75 function to bypass high frequencies to ground metallization 56.

Electrode 49 may extend as metallization 80 having a predetermined width to provide a characteristic impedance with respect to substrate 40 and metallization 60. Likewise, source electrode 50 may extend as metallization 81 having a predetermined width to provide a predetermined impedance. Metallizations 80 and 81 function as outputs from the phase inverter 37 wherein the phase of the output signals are 180° shifted with respect to each other.

Figure 4:
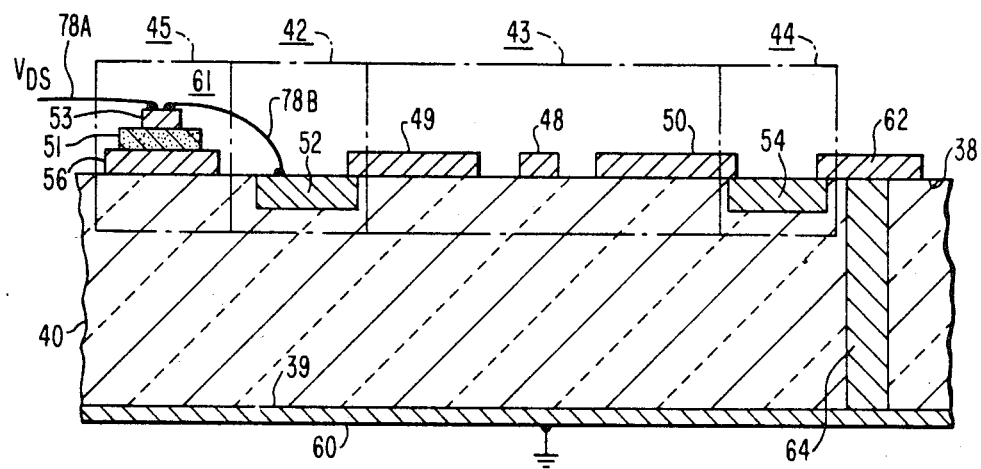
FIG. 4 is a cross-section view of FIG. 3, one embodiment of the invention.

FIG. 3 is bisected by line IV—IV to produce FIG. 4, a cross-section of the monolithic microwave phase inverter 37. The semi-insulating semi-conductor substrate 40 having active regions 41 through 45 on upper surface 38 are spaced co-linearly across upper surface 38. Active region 43, positioned between active regions 42 and 44 contains a metal semi-conductor field effect transistor 46. This MOSFET 46 comprising gate electrode 48, drain electrode 49 and source electrode 50, is bounded by active region 42 and active region 44. Active region 42 contains ion-implanted resistor 52 and active region 44 contains ion-implanted resistor 54. Alternatively, resistors 52 and 54 may be thin film resistors. Note, that the drain electrode 49 of the MOSFET 46 is positioned, touching the side wall of resistor 52 and that the source electrode 50 of the MOSFET 46 is also positioned against the side wall of ion-implanted resistor 54. Adjacent to active region 42 is active region 45. Active region 45 contains thin film capacitor 61 resting upon metallization 56. Thin film capacitor 61 comprises dielectric 51 and upper electrode 53. This thin film capacitor 61 is coupled by means of an air bridge of metallization or gold-bond wire 78B from the upper electrode 53 to the ion-implanted resistor 52. Active region 44 contains ion-implanted resistor 54. Ion-implanted reistor 54 is positioned between source electrode 50 and metallization 62. Metallization 62 rests upon the upper surface 38 of the semi-insulating semi-conductor substrate 40. Metallization 62 contains via hole 64 which contacts base metallization 60 on lower surface 39 of the semi-insulating semi-conductor 40. Metallization 62 is also positioned adjacent and extends over active region 44 and is therefore coupled to one side of resistor 54.

A phase inverter circuit has been described for generating two output signals of equal amplitude having 180° out-of-phase relationship from an input signal at microwave frequencies wherein the phase inverter circuit is fabricated on a semiconductor substrate such as gallium arsenide having a single field effect transistor such as a metal semiconductor field effect transistor with ion-implanted resistors coupled to the source and drain and to ground and a voltage supply, respectively. An ion-implanted resistor from ground to the gate electrode and from the gate electrode to a voltage source provides a means of providing a bias voltage to the gate.

The phase inverter shown in FIG. 3 has the advantage of requiring only one power supply since the source electrode of transistor 46 is biased above ground potential by a source resistor 54. The drain power supply, $V_{DS}$, with a voltage divider network shown by ion-implanted resistors 73 and 74 allows a negative gate bias to be derived.

We claim:

1. A phase inverter for generating first and second signals 180 degrees out-of-phase from an input signal, comprising:
    a semiconductor substrate,
    a field effect transistor in said substrate having a drain and source electrode and a gate electrode therebetween,
    a first resistor implanted within sid substrate coupled between said drain electrode and a voltage terminal,
    a second resistor implanted within said substrate coupled between said source electrode and a ground terminal,
    a compensation capacitor implanted within or layered upon said substrate having interdigitated fingers of a predetermined reactance positioned between said source electrode and said ground terminal,
    means for coupling said input signal to said gate electrode,
    means for coupling a bias voltage to said gate electrode, and
    means for coupling said first and said second signals from said drain and said source electrodes respectively.

2. The phase inverter of claim 1 wherein said semiconductor substrate is silicon.

3. The phase inverter of claim 1 wherein said semiconductor substrate is indium phosphide.

4. The phase inverter of claim 1 wherein said first and second resistors are resistors formed within the substrate via ion-implantation.

5. The phase inverter of claim 1 wherein said first and second resistors are thin film resistors formed upon the surface of the substrate.

6. The phase inverter of claim 1 wherein said field effect transistor is a metal semiconductor field effect transistor.

7. The phase inverter of claim 1 wherein said ground terminal includes first metallization on the upper surface of said substrate and vias coupling said first metallization to said second metallization positioned on the lower surface of said substrate.

8. An active microwave split load phase inverter circuit providing a first and a second microwave output signal which are 180° out of phase, comprising:
    a microwave field effect transistor having a drain electrode and a source electrode interconnected by equal value resistors implanted within a substrate to respectively bias potential means and to ground, wherein said drain electrode and said source electrode are connected to a first and a second microwave output signal terminal, with the gate of said microwave field effect transistor connectable to the input microwave signal;
    a capacitative compensation network means coupling at least one of the source and drain to ground, said capacitive compensation network means equalizes the output impedance of each of said first and second microwave output signal terminals;
    an impedance transforming network means connected to said first and said second microwave output signal terminals to provide an output signal gain of approximate unity.

9. The active microwave split load phase inverter circuit as in claim 8, wherein said capacitive compensation network further comprises a capacitor having interdigitated fingers.

* * * * *